United States Patent
Lo

(10) Patent No.: US 12,106,798 B2
(45) Date of Patent: Oct. 1, 2024

(54) RECEIVER CIRCUIT, MEMORY DEVICE AND OPERATION METHOD USING THE SAME

(71) Applicant: NANYA TECHNOLOGY CORPORATION, New Taipei (TW)

(72) Inventor: Chi-Sing Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/358,049

(22) Filed: Jul. 25, 2023

(65) Prior Publication Data

US 2023/0368835 A1 Nov. 16, 2023

Related U.S. Application Data

(63) Continuation of application No. 17/491,535, filed on Oct. 1, 2021, now Pat. No. 11,830,535.

(51) Int. Cl.
*G11C 11/4093* (2006.01)

(52) U.S. Cl.
CPC .............................. *G11C 11/4093* (2013.01)

(58) Field of Classification Search
CPC ............ G11C 7/065; G11C 7/062; G11C 7/06

USPC ....................................................... 365/189.05
See application file for complete search history.

(56) References Cited

U.S. PATENT DOCUMENTS

2003/0214341 A1* 11/2003 Cho ...................... G11C 7/1069
327/307
2021/0174844 A1* 6/2021 Choi ...................... G11C 16/24

* cited by examiner

*Primary Examiner* — Anthan Tran
(74) *Attorney, Agent, or Firm* — JCIPRNET

(57) ABSTRACT

A receiver circuit that includes a pair of pre-stage amplifier circuits and a post-stage amplifier circuit is introduced. The pre-stage amplifier circuits are configured to receive an input signal and a reference voltage signal, output first pre-stage amplifying signals through a first connection node and a second connection node separately, and output second pre-stage amplifying signals through a third connection node and a fourth connection node separately. The post-stage amplifier circuit is configured to receive the first pre-stage amplifying signals and the second pre-stage amplifying signals from the pair of pre-stage amplifier circuits through the first connection node, the second connection node, the third connection node and the fourth connection node separately, and output a post amplifying signal according to the first pre-stage amplifying signals and the second pre-stage amplifying signals.

8 Claims, 4 Drawing Sheets

RECEIVER CIRCUIT, MEMORY DEVICE AND OPERATION METHOD USING THE SAME

CROSS-REFERENCE TO RELATED APPLICATION

This application is a continuation application of and claims the priority benefit of U.S. patent application Ser. No. 17/491,535, filed on Oct. 1, 2021. The entirety of the above-mentioned patent application is hereby incorporated by reference herein and made a part of this specification.

BACKGROUND

Technical Field

The disclosure relates to a receiver circuit of a memory device, and more particularly to receiver circuit that is capable of reducing power consumption and expanding operating range of a reference voltage.

Description of Related Art

A memory is widely used to store data in many electronic devices including mobile devices, computers, self-driving cars, appliances and the like. The memory includes an input/output (IO) circuit for receiving and transmitting signals between the memory and other circuits. The IO circuit may include at least one receiver that operates according to a reference voltage.

As the receiver in different electronic device is operable in different ranges of the reference voltage, it is expected that the receiver is capable of operating in a wide range of the reference voltage. In addition, as the demand for low-power electronic devices has grown recently, it is desired to have the receiver with low-power consumption.

SUMMARY

The disclosure introduces a receiver circuit, a memory device and an operation method thereof that are capable of expanding operating range of the reference voltage, and reduce power consumption.

In some embodiments, the receiver circuit includes a pair of pre-stage amplifier circuits and a post-stage amplifier circuit. The pair of pre-stage amplifier circuits is configured to receive an input signal and a reference voltage signal and output first pre-stage amplifying signals and second pre-stage amplifying signals according to a difference between the input signal and the reference voltage signal. The pair of pre-stage amplifier circuits include a first pre-stage amplifier circuit and a second pre-stage amplifier circuit, in which the first pre-stage amplifier circuit includes a pair of first n-type transistors, and gate terminals of the first pair of the n-type transistors receive the input signal and the reference voltage signal, respectively. The second pre-stage amplifier circuit includes a pair of first p-type transistors, wherein gate terminals of the pair of the first p-type transistors receive the input signal and the reference voltage signal, respectively. The post-stage amplifier circuit is configured to receive the first pre-stage amplifying signals and the second pre-stage amplifying signals from the pair of pre-stage amplifier circuits, and output a post amplifying signal according to the first pre-stage amplifying signals and the second pre-stage amplifying signals.

In some embodiments, the memory device includes a memory core circuit having a plurality of memory cells, and a receiver circuit. The receiver circuit includes a pair of pre-stage amplifier circuits and a post-stage amplifier circuit. The pair of pre-stage amplifier circuits is configured to receive an input signal and a reference voltage signal and output first pre-stage amplifying signals and second pre-stage amplifying signals according to a difference between the input signal and the reference voltage signal. The pair of pre-stage amplifier circuits include a first pre-stage amplifier circuit and a second pre-stage amplifier circuit, in which the first pre-stage amplifier circuit includes a pair of first n-type transistors, and gate terminals of the first pair of the n-type transistors receive the input signal and the reference voltage signal, respectively. The second pre-stage amplifier circuit includes a pair of first p-type transistors, wherein gate terminals of the pair of the first p-type transistors receive the input signal and the reference voltage signal, respectively. The post-stage amplifier circuit is configured to receive the first pre-stage amplifying signals and the second pre-stage amplifying signals from the pair of pre-stage amplifier circuits, and output a post amplifying signal according to the first pre-stage amplifying signals and the second pre-stage amplifying signals.

In some embodiments, the operation method includes steps of receiving, by a pair of pre-stage amplifier circuits, an input signal and a reference voltage signal; outputting, by the pair of pre-stage amplifier circuits, first pre-stage amplifying signals and second pre-stage amplifying signals according to a difference between the input signal and the reference voltage signal; receiving, by a post-stage amplifier circuit, the first pre-stage amplifying signals and the second pre-stage amplifying signals from the pair of pre-stage amplifier circuits; and outputting, by a post-stage amplifier circuit, a post amplifying signal according to the first pre-stage amplifying signals and the second pre-stage amplifying signals. The pair of pre-stage amplifier circuits includes a first pre-stage amplifier circuit and a second pre-stage amplifier circuit. The first pre-stage amplifier circuit includes a pair of first n-type transistors, wherein gate terminals of the first pair of the n-type transistors receive the input signal and the reference voltage signal, respectively. The second pre-stage amplifier circuit includes a pair of first p-type transistors, wherein gate terminals of the pair of the first p-type transistors receive the input signal and the reference voltage signal, respectively.

According to the embodiments of the disclosure, the first pre-stage amplifier circuit, which includes a pair of p-type transistors for receiving input signals, may be referred to as a p-type amplifier circuit; and the second pre-stage amplifier circuit, which includes n-type transistors for receiving the input signal, may refer to as a n-type amplifier circuit. As the p-type amplifier circuit operates efficiently with a lower range of the reference voltage (also referred to as a first reference voltage range) and the n-type amplifier circuit operate efficiently with an upper range of the reference voltage (also referred to as a first reference voltage range), the receiver circuit in the disclosure may operate efficiently for a wide range of the reference voltage (i.e., both upper range and lower range). In addition, as the receiver circuit may disable one of the pre-stage amplifier circuits during operation of receiver circuit, power consumption of the receiver circuit is reduced.

DESCRIPTION OF THE EMBODIMENTS

Figure 1:
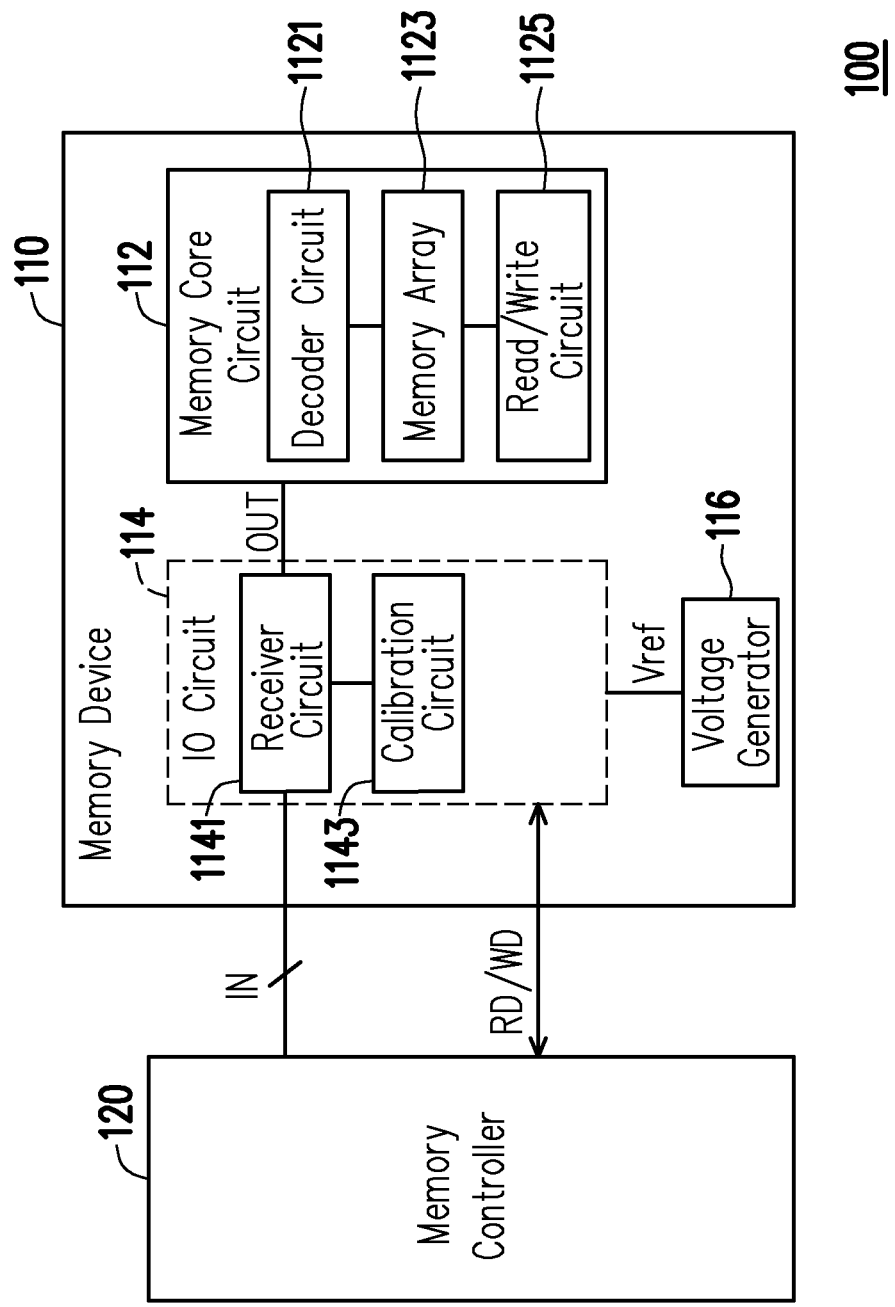
FIG. 1 is a schematic diagram illustrating a memory system in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a memory system 100 that includes a memory device 110 and a memory controller 120 in accordance with some embodiments. The memory device 110 may include a memory core circuit 112 and an input/output (IO) circuit 114. The memory core circuit 112 is configured to store data and perform memory operations such as a read operation, a program operation, an erase operation. The IO circuit 114 is configured to receive and transmits signals between the memory device 110 and the memory controller 120. In an embodiment, the memory device 110 is a dynamic random-access memory (DRAM), but the disclosure is not limited thereto. Any other types of the memory device 110 fall within the scope of the disclosure.

In an embodiment, the memory core circuit 112 includes a decoder circuit 1121, a memory array 1123, and a read/write circuit 1125. The memory array 1123 includes a plurality of memory cells (not shown) for storing data, in which each of the memory cells is associated with a memory address. The decoder circuit 1121 is coupled to the memory array and the IO circuit 114, configured to decode an address signal received from the IO circuit 114 to select at least one memory cell for a memory operation. The read/write circuit 1125 is coupled to the memory array 1123 and the IO circuit 114, and is configured to perform the memory operations to the memory cells of the memory array 1123. In an example, the read/write circuit 1125 may perform a read operation to read data RD from selected memory cells of the memory array 1123, and output the read data RD to the memory controller 120. In another example, the read/write circuit 1125 may perform a program operation to write data WD to selected memory cells in the memory array 1123. The write data WD may be obtained from the memory controller 120 through the IO circuit 114.

In an embodiment, the IO circuit 114 includes a receiver circuit 1141 that receives an input signal IN and a reference voltage signal Vref. The receiver circuit 1141 is configured to amplify a difference between the reference voltage signal Vref and the input signal IN to generate an output signal OUT. The output signal OUT may be supplied to the memory core circuit 112 for decoding and performing memory operations. In an embodiment, the receiver circuit 1141 is a single ended receiver circuit that receives only one input signal (i.e., input signal IN), and operates according to the reference signal Vref to output the output signal OUT. For example, the receiver circuit 1141 is a command and address receiver circuit that receives an address/command (C/A) signal, and is configured to amplify a difference between the reference voltage signal Vref and the C/A signal to generate the output signal OUT. The C/A signal may include at least one of an address signal and a command signal, where the address signal defines the memory addresses of selected memory cells for an operation, and the command signal defines an operation that is performed to the selected memory cells.

In some embodiments, the IO circuit 114 further includes a calibration circuit 1143 that is coupled to the receiver circuit 1141 and is configured to calibrate the reference voltage signal Vref during a calibration mode of the receiver circuit 1141. During the calibration mode, the level of reference voltage signal Vref is varied in an incremental matter of decremental manner, and the output signal OUT of the receiver circuit 1141 is analyzed to determine an operable voltage range of the reference voltage signal Vref that allows the receiver circuit 1141 to operate correctly. In an example, a test pattern (not shown) and each level of the reference voltage signal Vref are inputted to the receiver circuit 1141, and the output signal OUT of the receiver circuit 1141 is analyzed to determine whether the receiver circuit 1141 receives correctly the test pattern at each level of reference voltage signal Vref. In this way, the operable voltage range of the reference voltage signal Vref may be determined in the calibration mode of the receiver circuit 1141.

In an embodiment, the calibration mode of the receiver circuit 1141 may be triggered by an activation signal (not shown). In an example, the calibration mode of the receiver circuit 1141 is triggered to calibrate the reference voltage signal Vref each time the receiver circuit 1141 is powered up. It is appreciated that the disclosure is not limited to the condition that trigger the calibration mode of the receiver circuit 1141. In addition, the location of the calibration circuit 1143 is not limited in the disclosure. For example, the calibration circuit 1143 may be located inside the receiver circuit 1141. The receiver circuit 1141 may include circuits (not shown) that are designed to receive or transmit signals between the memory device 110 and the memory controller 120.

After the calibration mode of the receiver circuit 1141 is performed, the operable voltage range of the reference voltage signal Vref is determined. In an embodiment, a fixed level of the reference voltage signal Vref (i.e., fixed reference voltage signal) is selected from the operable voltage range of the reference voltage signal Vref, such that the fixed reference voltage signal is used in the operation mode of the receiver circuit 1141. In an embodiment, the fixed reference voltage signal is the middle voltage in the operable voltage range of the reference voltage signal Vref, but the disclosure is not limited to any particular way to select the fixed reference voltage for the operation mode.

In an embodiment, at least one of the operable voltage range of the reference voltage Vref and the fixed reference voltage signal Vref is stored in a register or a non-volatile memory included in the memory device 110. The fixed reference voltage signal Vref may be stored in the memory cells of the memory core circuit 112 or any other register, memory of the memory device 110. The fixed reference voltage signal Vref is used during the operation mode of the receiver circuit 1141.

In some embodiments, the memory device 110 further includes a voltage generator 116 that is configured to generate voltages for operations of the memory device 110. The voltage generator 116 may generate the reference voltage signal Vref, and provide the generated reference voltage signal Vref to the receiver circuit 1141 in the IO circuit 114. In some embodiments, the voltage generator 116 generates the reference voltage signal Vref with varied levels in the calibration mode of the receiver circuit 1141. The levels of the reference voltage signal Vref may be varied in an incremental manner or in a decremental manner. In the operation mode, the voltage generator 116 is configured to generate and supply the fixed reference voltage signal Vref to the receiver circuit 1141.

Figure 2:
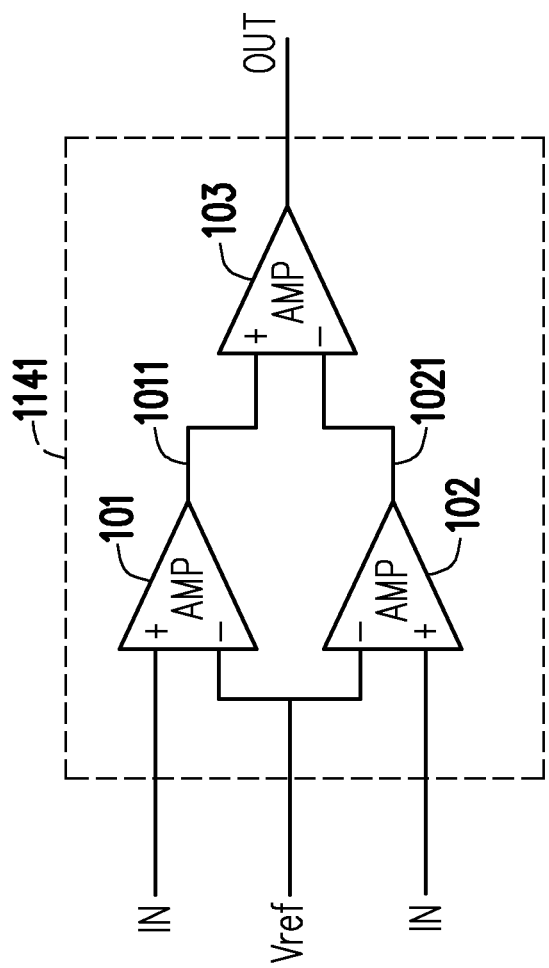
FIG. 2 is a schematic diagram illustrating a receiver circuit in accordance with some embodiments.

FIG. 2 illustrates a schematic diagram of the receiver circuit 1141 that includes a pair of pre-stage amplifier circuits 101 and 102, and a post-stage amplifier circuit 103 in accordance with some embodiments. The pre-stage amplifier circuit 101 receives the input signal IN and the reference voltage signal Vref and outputs pre-stage amplifying signal 1011 based on a difference between the input signal IN and the reference voltage signal Vref. Similarly, the pre-stage amplifier circuit 102 receives the input signal IN and the reference voltage signal Vref and outputs pre-stage amplifying signal 1021 based on the difference between the input signal IN and the reference voltage signal Vref. In an embodiment, the pre-stage amplifier circuits 101 and 102 are differential amplifiers of different types. In an example, the pre-stage amplifier circuit 101 is a p-type differential amplifier, and the pre-stage amplifier circuit 102 is a n-type differential amplifier. The pre-stage amplifier circuits 101 and 102 are configured to amplify the difference between the input signal IN and the reference voltage signal Vref to generate the pre-stage amplifying signals 1011 and 1021, respectively.

The post-stage amplifier circuit 103 is coupled to the pre-stage amplifier circuits 101 and 102 to receive the pre-stage amplifying signals 1011 and 1021 from the pre-stage amplifier circuits 101 and 102. The post-stage amplifier circuit 103 is configured to generate an output signal OUT (also referred to as a post amplifying signal) based on the pre-stage amplifying signals 1011 and 1021. The output signal OUT may be supplied to the memory core circuit 112 for further processing.

Figure 3:
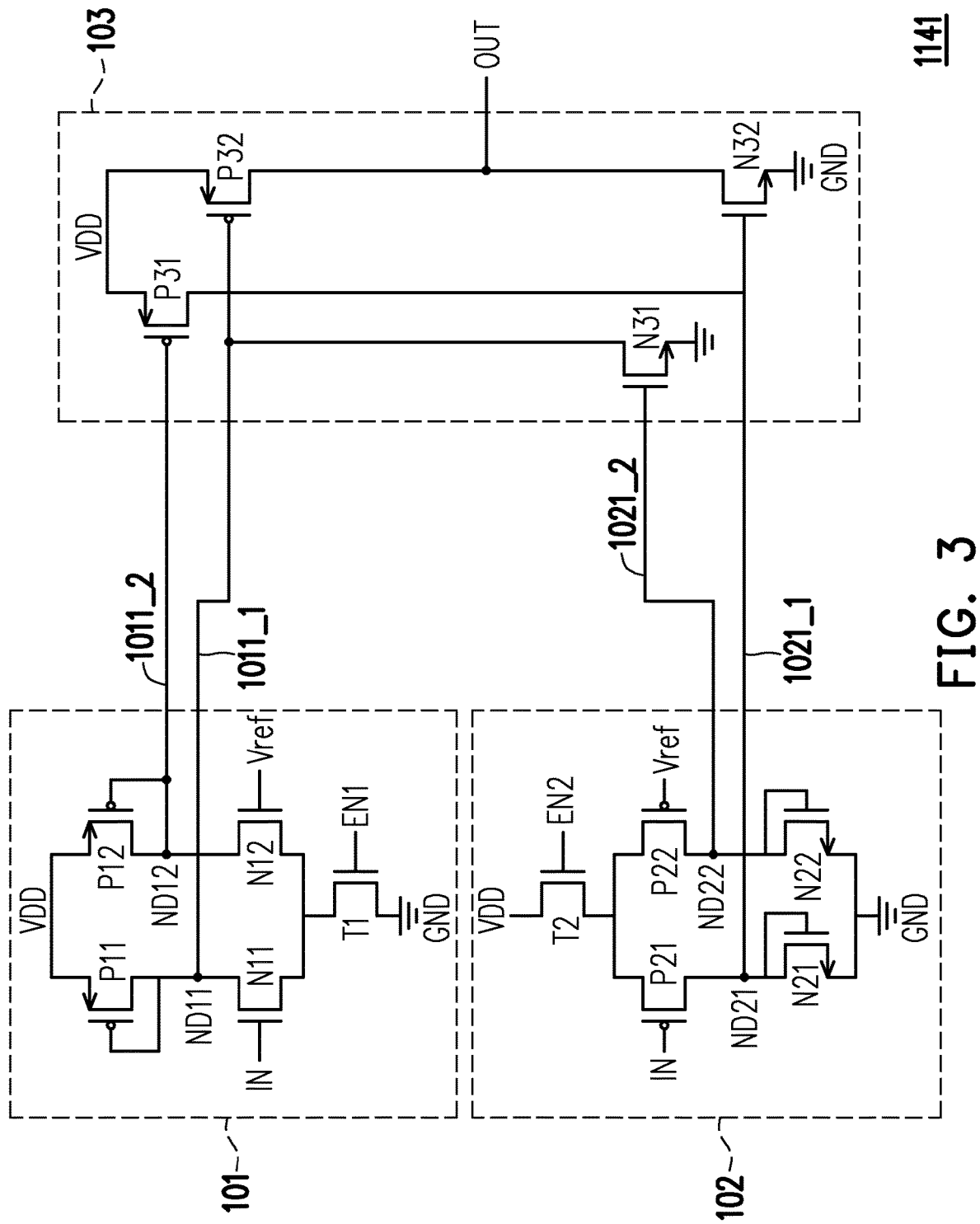
FIG. 3 illustrates a detailed structure of the receiver circuit in FIG. 2 in accordance with some embodiments.

FIG. 3 illustrates a detailed structure of the receiver circuit 1141 that includes the pre-stage amplifier circuits 101 and 102 and the post-stage amplifier circuit 103 in accordance with some embodiments. The pre-stage amplifier circuit 101 includes a pair of p-type transistors P11 and P12, in which the source terminals of the p-type transistors P11 and P12 are coupled to the reference node that receives the power voltage VDD, and the gate terminals of the p-type transistors P11 and P12 are coupled to the drain terminals of the p-type transistors P11 and P12. In other words, the p-type transistors P11 and P12 are designed as diodes in the pre-stage amplifier circuit 101. The pre-stage amplifier circuit 101 further includes a pair of n-type transistors N11 and N12, where the drain terminals of the n-type transistors N11 and N12 are coupled to the drain terminals of p-type transistors P11 and P12 through connection nodes ND11 and ND12. The gate terminals of the n-type transistors N11 and N12 receive the input signal IN and the reference voltage signal Vref, respectively.

The pre-stage amplifier circuit 101 receives the input signal IN and the reference voltage signal Vref through the gate terminals of the n-type transistors N11 and N12. The pre-stage amplifier circuit 101 is configured to amplify a difference between the input signal IN and the reference voltage signal Vref to generate pre-stage amplifying signals 1011_1 and 1011_2 through the connection nodes ND11 and ND12, respectively. The pre-stage amplifying signals 1011_1 and 1011_2 may be considered as the differential output signal of the pre-stage amplifier circuit 101. The pre-stage amplifier circuit 101 outputs the pre-stage amplifying signals 1011_1 and 1011_2 to the post-stage amplifier circuit 103 through the connection nodes ND11 and ND12.

The pre-stage amplifier circuit 102 may include a pair of n-type transistors N21 and N22, in which the source terminals of the n-type transistors N21 and N22 are coupled to the reference node that receives the power voltage GND, and the gate terminals of the n-type transistors N21 and N22 are coupled to the drain terminals of the n-type transistors N21 and N22, respectively. In other words, the n-type transistors N21 and N22 are designed as diodes in the pre-stage amplifier circuit 102. The pre-stage amplifier circuit 102 further includes a pair of p-type transistors P21 and P22, where the drain terminals of the p-type transistors P21 and P22 are coupled to the drain terminals of n-type transistors N21 and N22 through connection nodes ND21 and ND22. The gate terminals of the p-type transistors P21 and P22 receive the input signal IN and the reference voltage signal Vref, respectively.

The pre-stage amplifier circuit 102 receives the input signal IN and the reference voltage signal Vref through the gate terminals of the n-type transistors P21 and P22. The pre-stage amplifier circuit 102 is configured to amplify a difference between the input signal IN and the reference voltage signal Vref to generate pre-stage amplifying signals 1021_1 and 1021_2 through the connection nodes ND21 and ND22, respectively. The pre-stage amplifying signals 1021_1 and 1021_2 may be considered as the differential output signals of the pre-stage amplifier circuit 102. The pre-stage amplifier circuit 102 outputs the pre-stage amplifying signals 1021_1 and 1021_2 to the post-stage amplifier circuit 103 through the connection nodes ND21 and ND22.

In the above embodiments, the pre-stage amplifier circuit 101, that includes the pair of n-type transistor N11 and N12 for receiving the input signal IN and the reference voltage signal Vref, may be referred to as a n-type amplifier circuit; and the pre-stage amplifier circuit 102, that includes the pair of p-type transistor P21 and P22 for receiving the input signal IN and the reference voltage signal Vref, may be referred to as a p-type amplifier circuit. When the reference voltage signal Vref is in a first reference voltage range (i.e., upper voltage range or high voltage range), the n-type amplifier circuit operates well while the p-type amplifier circuit may lose gain. On the contrary, when the reference voltage signal Vref is in a second reference voltage range (i.e., lower voltage range), the p-type amplifier circuit operates well while the n-type amplifier circuit may lose gain. In the embodiments of the disclosure, the receiver circuit 1141 includes both the n-type amplifier circuit (i.e., the pre-stage amplifier circuit 101) and the p-type amplifier circuit (i.e., pre-stage amplifier circuit 102), the receiver circuit 1141 may operate well with both the upper voltage range and lower voltage range of the reference voltage signal Vref. In other words, the receiver circuit 1141 may operate well in a wide range of the reference voltage signal Vref without losing gain performance of the receiver circuit 1141.

In some embodiments, the pre-stage amplifier circuits 101 and 102 further includes enable switches T1 and T2 that are configured to enable or disable the pre-stage amplifier circuits 101 and 102. Particularly, the pre-stage amplifier circuit 101 includes the enable switch T1 that is configured to enable or disable the pre-stage amplifier circuit 101 according to the enable signal EN1. The pre-stage amplifier circuit 102 includes the enable switch T2 that is configured to enable or disable the pre-stage amplifier circuit 102 according to the enable signal EN2. In an embodiment, one of the pre-stage amplifier circuits 101 and 102 may be disabled during the operation mode of the receiver circuit 1141 to save power consumption.

In this embodiment, one of the n-type amplifier circuit (i.e., the pre-stage amplifier circuit 101) and the p-type amplifier circuit (i.e., pre-stage amplifier circuit 102) could be disabled to save power consumption of the receiver circuit 1141 without reducing the performance of the receiver circuit 1141. For example, when the reference voltage signal Vref is relatively high (i.e., in the upper voltage range), the p-type amplifier circuit, which has poor performance with the high reference voltage signal Vref, could be disabled to save power consumption. Similarly, when the reference voltage signal Vref is relatively low (i.e., in the low voltage range), the n-type amplifier circuit, which has poor performance with the low reference voltage signal Vref, could be disabled to save power consumption. In this way, the power consumption of the receiver circuit 1141 is reduced without reducing the performance of the receiver circuit 1141.

In some embodiments, the post-stage amplifier circuit 103 includes p-type transistors P31 and P32 and n-type transistors N31 and N32, in which the p-type transistors P31 and P32 are coupled to the pre-stage amplifier circuit 101 and the n-type transistors N31 and N32 are coupled to the pre-stage amplifier circuit 102. Specifically, the gate terminals of the p-type transistors P31 and P32 are coupled to the connection nodes ND11 and ND12 of the pre-stage amplifier circuit 101 to receive the pre-stage amplifying signals 1011_1 and 1011_2 from the connection nodes ND11 and ND12. The gate terminals of the n-type transistors N31 and N32 are coupled to the connection nodes ND21 and ND22 of the pre-stage amplifier circuit 102 to receive the pre-stage amplifying signals 1021_1 and 1021_2 from the connection nodes ND21 and ND22.

In this embodiment, the source terminals of the p-type transistors P31 and P31 receive the power voltage VDD, the drain terminal of the p-type transistor P31 is coupled to the gate terminal of the n-type transistor N32, and the drain terminal of the p-type transistor P32 is coupled to the drain terminal of the n-type transistor N32. In addition, the source terminals of the n-type transistors N31 and N32 receive the ground voltage GND, the drain terminal of the n-type transistor N31 is coupled to the gate terminal of the transistor P32, and the drain terminal of the n-type transistor N32 is coupled to the drain terminal of the p-type transistor P32.

In an embodiment, the post-stage amplifier circuit 103 is configured to combine the pre-stage amplifying signals 1011_1 and 1011_2 and the pre-stage amplifying signals 1021_1 and 1021_2 to generate the output signal OUT. The output signal OUT may also be referred to as a post amplifying signal which is an amplified signal of the difference between the input signal IN and the reference voltage signal Vref. The receiver circuit 1141 may amplify the difference between the input signal IN and the reference voltage signal Vref by a gain, in which the gain is determined according to the n-type transistors and p-type transistors included in the pre-stage amplifier circuits 101 and 102, and the post-stage amplifier circuit 103. In an embodiment, the gain is determined according to sizes of the p-type transistors P31, P32, P11, P12, and the sizes of the n-type transistors N31, N32, N21, N22. The size of a transistor may refer to a width of the transistor, a length of the transistor, or a ratio of the width and length of the transistor.

In an embodiment, the p-type transistors P31 and P32 are identical in size and are collectively referred to as transistor pm2, the p-type transistors P11 and P12 are identical in size and are collectively referred to as transistor pm1; the n-type transistors N31 and N32 are identical in size and are collectively referred to as transistor nm2; and the n-type transistors N21 and N22 are identical in size and are collectively referred to as transistor nm1. In this embodiment, the gain depends on a ratio of a size of the transistor pm2 and the size of the transistor pm1. The gain also depends on a ratio of a size of the transistor nm2 and the size of the transistor nm1.

Figure 4:
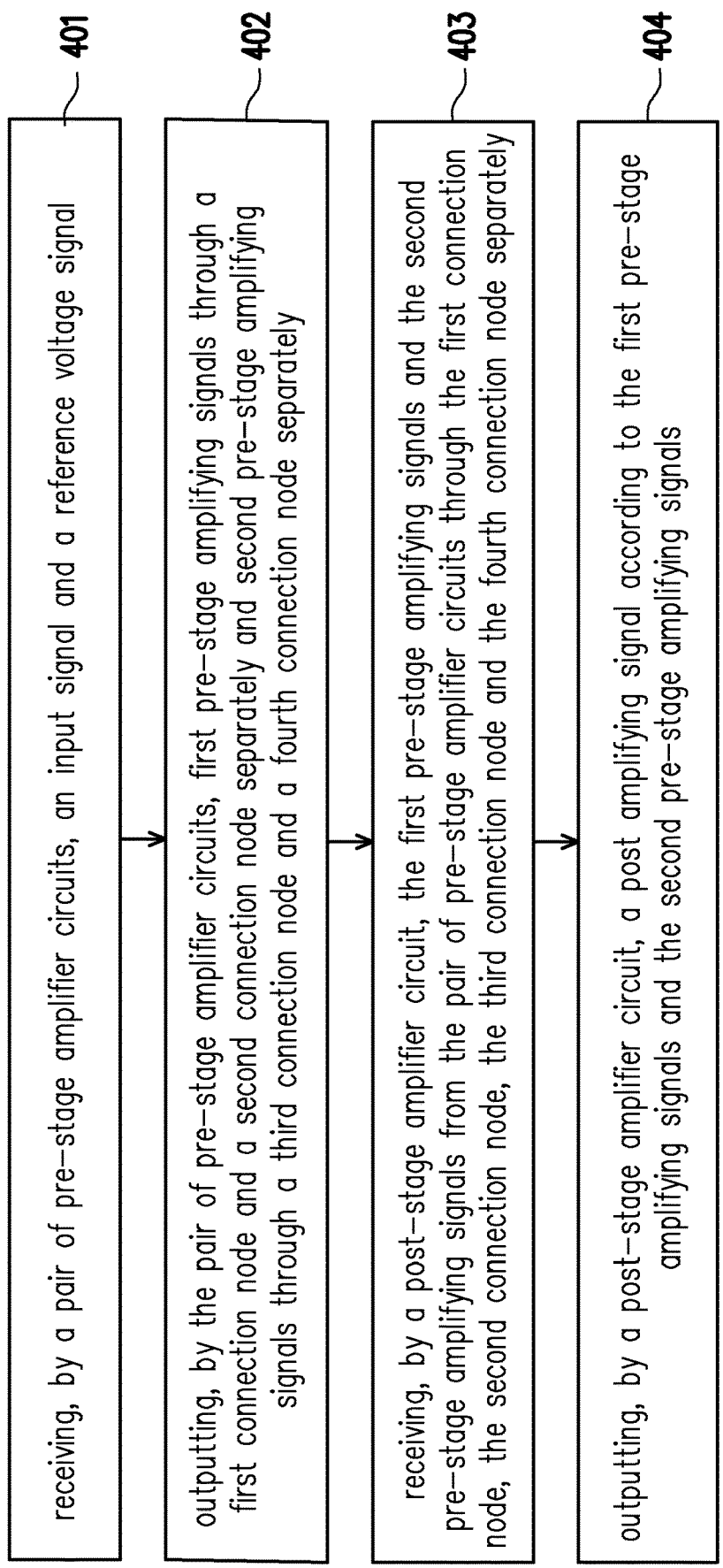
FIG. 4 is a flowchart diagram illustrating an operation method of a receiver circuit in accordance with some embodiments.

FIG. 4 is a flowchart diagram illustrating an operation method of a receiver circuit in accordance with some embodiments. The receiver circuit 1141 includes by a pair of pre-stage amplifier circuits and a post-stage amplifier circuit. In block 401, an input signal and a reference voltage signal are received by the pair of pre-stage amplifier circuits. In block 402, first pre-stage amplifying signals are output through a first connection node and a second connection node separately, and second pre-stage amplifying signals are output through a third connection node and a fourth connection node separately. In block 403, the first pre-stage amplifying signals and the second pre-stage amplifying signals are received by the post-stage amplifier circuit through the first connection node, the second connection node, the third connection node and the fourth connection node separately. In block 404, a post amplifying signal is output by a post-stage amplifier circuit according to the first pre-stage amplifying signals and the second pre-stage amplifying signals. The pair of pre-stage amplifier circuits comprises a first pre-stage amplifier circuit, including a pair of first n-type transistors, wherein gate terminals of the first pair of the n-type transistors receive the input signal and the reference voltage signal, respectively, and a second pre-stage amplifier circuit, including a pair of first p-type transistors, wherein gate terminals of the pair of the first p-type transistors receive the input signal and the reference voltage signal, respectively.

In summary, the receiver circuit 1141 includes both a n-type amplifier circuit and a p-type amplifier circuit, in which the n-type amplifier circuit operates well with an upper voltage range of the reference voltage, and the p-type amplifier circuit operates well with a lower voltage range of the reference voltage. In this way, the receiver circuit 1141 may operate well in a wide range of the reference voltage signal Vref. In addition, the receiver circuit 1141 may disable one of the n-type amplifier circuit and the p-type amplifier circuit based on the level of the reference voltage signal Vref, thus the power consumption of the receiver circuit 1141 is reduced.

Although the embodiment of the disclosure has been described in detail, the disclosure is not limited to a specific embodiment and various modifications and changes are possible within the scope of the disclosure disclosed in the claims.

What is claimed is:

1. A receiver circuit, comprising:
a pair of pre-stage amplifier circuits, receiving an input signal and a reference voltage signal, outputting first pre-stage amplifying signals through a first connection node and a second connection node separately, and outputting second pre-stage amplifying signals through a third connection node and a fourth connection node separately; and
a post-stage amplifier circuit, receiving the first pre-stage amplifying signals and the second pre-stage amplifying signals from the pair of pre-stage amplifier circuits through the first connection node, the second connection node, the third connection node and the fourth connection node separately, outputting a post amplifying signal according to the first pre-stage amplifying signals and the second pre-stage amplifying signals, wherein the pair of pre-stage amplifier circuits comprises a first pre-stage amplifier circuit, and the first pre-stage amplifier circuit comprises:

a first p-type transistor, wherein a gate terminal of the first p-type transistor is coupled to a drain terminal of the first p-type transistor, and the drain terminal of the first p-type transistor is coupled to the first connection node; and a second p-type transistor, wherein a gate terminal of the second p-type transistor is coupled to a drain terminal of the second p-type transistor, and the drain terminal of the second p-type transistor is coupled to the second connection node.

2. The receiver circuit according to claim 1, wherein the first pre-stage amplifier circuit further comprises:

a first n-type transistor, wherein a gate terminal of the first n-type transistor receives the input signal, a drain terminal of the first n-type transistor is coupled to the first connection node; and a second n-type transistor, wherein a gate terminal of the second n-type transistor receives the reference voltage signal, a drain terminal of the second n-type transistor is coupled to the second connection node.

3. The receiver circuit according to claim 1, wherein the first pre-stage amplifier circuit further comprises:

a first enable switch, coupled between a first power supply terminal and source terminals of the first n-type transistor and the second n-type transistor, configured to enable the first pre-stage amplifier circuit according to a first enable signal, wherein the first enable switch is configured to disable the first pre-stage amplifier circuit by stopping supplying power to the first pre-stage amplifier circuit when the reference voltage signal is in a first reference voltage range.

4. The receiver circuit according to claim 1, wherein the pair of pre-stage amplifier circuits comprises a second pre-stage amplifier circuit, and the second pre-stage amplifier circuit comprises:

a third p-type transistor, a gate terminal of the third p-type transistor receives the input signal, a drain terminal of the third p-type transistor is coupled to the third connection node; and a fourth p-type transistor, a gate terminal of the fourth p-type transistor receives the reference voltage, a drain terminal of the fourth p-type transistor is coupled to the fourth connection node.

5. The receiver circuit according to claim 4, wherein the second pre-stage amplifier circuit further comprises:

a third n-type transistor, wherein a gate terminal of the third n-type transistor is coupled to a drain terminal of the third n-type transistor, and the drain terminal of the third n-type transistor is coupled to the third connection node; and a fourth n-type transistor, wherein a gate terminal of the fourth n-type transistor is coupled to a drain terminal of the fourth n-type transistor, and the drain terminal of the fourth n-type transistor is coupled to the fourth connection node.

6. The receiver circuit according to claim 5, wherein the second pre-stage amplifier circuit further comprises:

a second enable switch, coupled between a second power supply terminal and source terminals of the third p-type transistor and the fourth-type transistor, configured to enable the second pre-stage amplifier circuit according to a second enable signal, wherein the second enable switch is configured to disable the second pre-stage amplifier circuit by stopping supplying power to the second pre-stage amplifier circuit when the reference voltage signal is in a second reference voltage range.

7. The receiver circuit according to claim 1, wherein the post-stage amplifier circuit comprises:

a pair of p-type transistors, wherein gate terminals of the pair of p-type transistors are coupled to the first pre-stage amplifier circuit to receive the first pre-stage amplifying signals from the first pre-stage amplifier circuit;

a pair of n-type transistors, wherein gate terminals of the pair of n-type transistors are coupled to the second first pre-stage amplifier circuit to receive the second pre-stage amplifying signals from the second pre-stage amplifier circuit.

8. An operation method of a receiver circuit, the operation method comprising:

receiving, by a pair of pre-stage amplifier circuits, an input signal and a reference voltage signal;

outputting, by the pair of pre-stage amplifier circuits, first pre-stage amplifying signals through a first connection node and a second connection node separately and second pre-stage amplifying signals through a third connection node and a fourth connection node separately;

receiving, by a post-stage amplifier circuit, the first pre-stage amplifying signals and the second pre-stage amplifying signals from the pair of pre-stage amplifier circuits through the first connection node, the second connection node, the third connection node and the fourth connection node separately; and outputting, by a post-stage amplifier circuit, a post amplifying signal according to the first pre-stage amplifying signals and the second pre-stage amplifying signals, wherein the pair of pre-stage amplifier circuits comprises a first pre-stage amplifier circuit, and the first pre-stage amplifier circuit comprises:

a first p-type transistor, wherein a gate terminal of the first p-type transistor is coupled to a drain terminal of the first p-type transistor, and the drain terminal of the first p-type transistor is coupled to the first connection node; and a second p-type transistor, wherein a gate terminal of the second p-type transistor is coupled to a drain terminal of the second p-type transistor, and the drain terminal of the second p-type transistor is coupled to the second connection node.

* * * * *